(12) United States Patent
Jeng et al.

(10) Patent No.: US 10,347,574 B2
(45) Date of Patent: Jul. 9, 2019

(54) INTEGRATED FAN-OUT PACKAGES

(71) Applicant: Taiwan Semiconductor Manufacturing Co., Ltd., Hsinchu (TW)

(72) Inventors: Shin-Puu Jeng, Hsinchu (TW); Dai-Jang Chen, New Taipei (TW); Hsiang-Tai Lu, Hsinchu County (TW); Hsien-Wen Liu, Hsinchu (TW); Chih-Hsien Lin, Tai-Chung (TW); Shih-Ting Hung, New Taipei (TW); Po-Yao Chuang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/876,227

(22) Filed: Jan. 22, 2018

(65) Prior Publication Data

US 2019/0096791 A1    Mar. 28, 2019

Related U.S. Application Data

(60) Provisional application No. 62/565,065, filed on Sep. 28, 2017.

(51) Int. Cl.
*H01L 23/49* (2006.01)
*H01L 23/31* (2006.01)
(Continued)

(52) U.S. Cl.
CPC ........ *H01L 23/49822* (2013.01); *H01L 21/56* (2013.01); *H01L 22/14* (2013.01); *H01L 22/32* (2013.01); *H01L 23/3114* (2013.01); *H01L 23/5383* (2013.01); *H01L 23/5384* (2013.01); *H01L 23/5389* (2013.01); *H01L 24/03* (2013.01); *H01L 24/81* (2013.01);
(Continued)

(58) Field of Classification Search
CPC ........... H01L 23/49822; H01L 23/3114; H01L 23/3736; H01L 23/49833; H01L 22/14; H01L 22/32; H01L 24/03; H01L 24/81; H01L 25/0657; H01L 25/50; H01L 25/043; H01L 25/074; H01L 25/0756; H01L 25/117
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Ida M Soward
(74) *Attorney, Agent, or Firm* — JCIPRNET

(57) ABSTRACT

Integrated fan-out packages and methods of forming the same are disclosed. An integrated fan-out package includes a first semiconductor chip, a plurality of through integrated fan-out vias, an encapsulation layer and a redistribution layer structure. The first semiconductor chip includes a heat dissipation layer, and the heat dissipation layer covers at least 30 percent of a first surface of the first semiconductor chip. The through integrated fan-out vias are aside the first semiconductor chip. The encapsulation layer encapsulates the through integrated fan-out vias. The redistribution layer structure is at a first side of the first semiconductor chip and thermally connected to the heat dissipation layer of the first semiconductor chip.

20 Claims, 11 Drawing Sheets

(51) Int. Cl.

| | | |
|---|---|---|
| H01L 25/04 | (2014.01) | |
| H01L 25/07 | (2006.01) | |
| H01L 25/11 | (2006.01) | |
| H01L 23/498 | (2006.01) | |
| H01L 21/66 | (2006.01) | |
| H01L 25/065 | (2006.01) | |
| H01L 21/56 | (2006.01) | |
| H01L 23/00 | (2006.01) | |
| H01L 25/00 | (2006.01) | |
| H01L 23/538 | (2006.01) | |
| H01L 23/373 | (2006.01) | |
| H01L 25/075 | (2006.01) | |
| H01L 23/36 | (2006.01) | |
| H01L 23/367 | (2006.01) | |

(52) U.S. Cl.
CPC .......... *H01L 25/0657* (2013.01); *H01L 25/50* (2013.01); *H01L 23/36* (2013.01); *H01L 23/3677* (2013.01); *H01L 23/3736* (2013.01); *H01L 23/49833* (2013.01); *H01L 25/043* (2013.01); *H01L 25/074* (2013.01); *H01L 25/0756* (2013.01); *H01L 25/117* (2013.01); *H01L 2224/02331* (2013.01); *H01L 2224/02379* (2013.01); *H01L 2224/0401* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,318,442 B1* | 4/2016 | Chen | H01L 21/4857 |
| 9,368,460 B2 | 6/2016 | Yu et al. | |
| 9,372,206 B2 | 6/2016 | Wu et al. | |
| 9,385,109 B2* | 7/2016 | Kim | H01L 25/50 |
| 9,392,698 B2* | 7/2016 | Hong | H01L 23/13 |
| 9,496,189 B2 | 11/2016 | Yu et al. | |
| 9,570,418 B2* | 2/2017 | Chen | H01L 24/19 |
| 9,583,430 B2* | 2/2017 | Park | H01L 23/3128 |
| 9,991,245 B2* | 6/2018 | Kim | H01L 23/367 |
| 10,211,136 B2* | 2/2019 | Kim | H01L 23/36 |
| 2012/0319254 A1* | 12/2012 | Kikuchi | H01L 23/5389 257/659 |
| 2015/0179617 A1* | 6/2015 | Lin | H01L 25/0657 257/713 |
| 2017/0133353 A1* | 5/2017 | Lin | H01L 25/0657 |
| 2017/0207204 A1* | 7/2017 | Lin | H01L 25/105 |
| 2017/0301608 A1* | 10/2017 | Chang | H01L 23/4334 |
| 2017/0345763 A1* | 11/2017 | Cheah | H01L 24/16 |
| 2018/0204802 A1* | 7/2018 | Lin | H01L 23/36 |
| 2019/0013288 A1* | 1/2019 | Kim | H01L 24/24 |

* cited by examiner

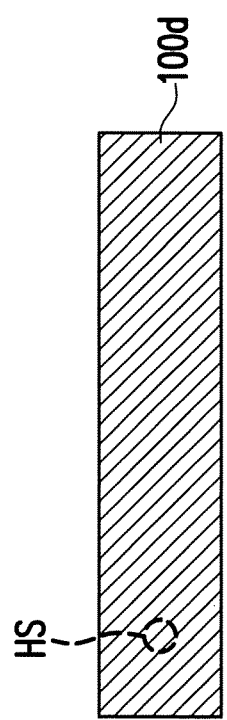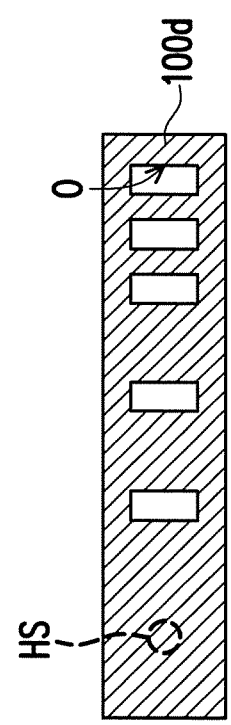

US 10,347,574 B2

INTEGRATED FAN-OUT PACKAGES

CROSS-REFERENCE TO RELATED APPLICATION

This application claims the priority benefit of U.S. provisional application Ser. No. 62/565,065, filed on Sep. 28, 2017. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, integrated fan-out packages are becoming increasingly popular for their compactness. However, the heat dissipation is a challenge in a variety of packages.

BRIEF DESCRIPTION OF THE DRAWINGS

FIG. 3 is a top view of a heat dissipation layer of an integrated fan-out package in accordance with some embodiments.

FIG. 4 is a top view of a heat dissipation layer of an integrated fan-out package in accordance with alternative embodiments.

DETAILED DESCRIPTION

Figure 1A:
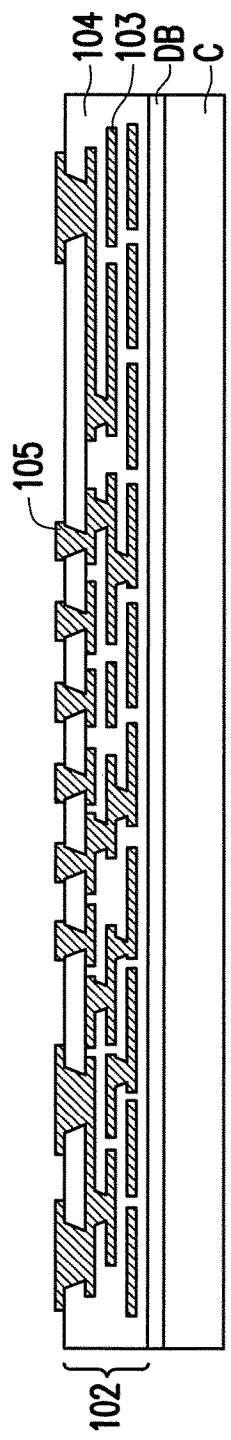
FIG. 1A to FIG. 1F are cross-sectional views of a method of forming an integrated fan-out package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, a "thermal" or "thermally conductive" element indicates the element is configured to conduct heat from inside a structure to outside the structure. In some embodiments, a thermal element is both thermally and electrically conductive. In alternative embodiments, a thermal element is merely thermally conductive.

Herein, when an element is described as being "thermally connected to" another element, it means that the element is in direct contact with or in physical contact with the another element, or that few thermally conductive elements are positioned between the element and the another element.

FIG. 1A to FIG. 1F are cross-sectional views of a method of forming an integrated fan-out package in accordance with some embodiments. FIG. 2 is a simplified top view of an integrated fan-out package in accordance with some embodiments, in which few elements such as thermal through integrated fan-out vias, thermal vias, a redistribution layer structure, and a heat dissipation layer are shown for simplicity and clarity of illustration.

Figure 2:
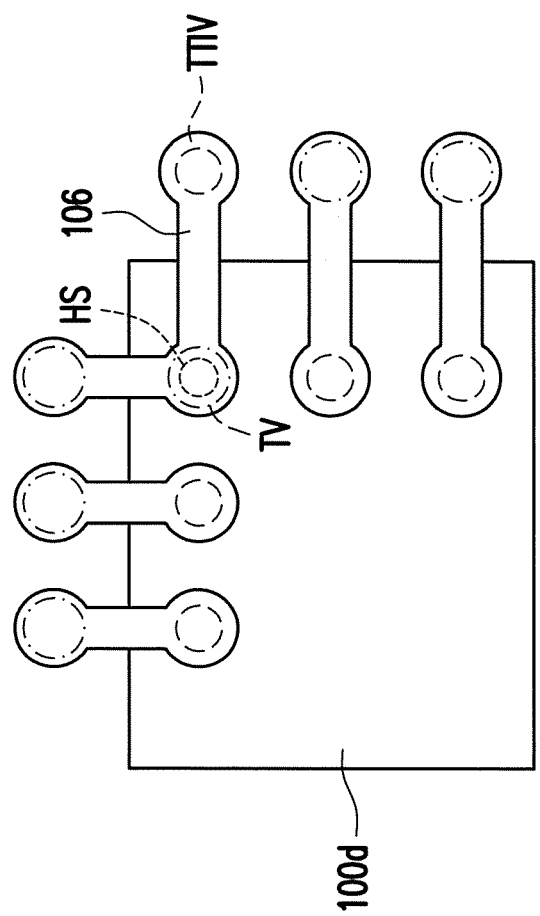
FIG. 2 is a simplified top view of an integrated fan-out package in accordance with some embodiments.

Referring to FIG. 1A, a carrier C is provided with a redistribution layer structure 102 formed thereon. In some embodiments, a debonding layer DB is formed between the carrier C and the redistribution layer structure 102. In some embodiments, the carrier C is a non-semiconductor material, such as a glass carrier, a ceramic carrier, an organic carrier, or the like. In some embodiments, the debonding layer DB includes a Ultra-Violet (UV) glue, a Light-to-Heat Conversion (LTHC) glue, or the like, although other types of adhesives may be used. The debonding layer DB is decomposable under the heat of light to thereby release the carrier C from the structure formed thereon.

In some embodiments, the redistribution layer structure 102 is referred to as a "front-side redistribution layer structure" through the specification. In some embodiments, the redistribution layer structure 102 includes a plurality of redistribution layers 103 embedded by a plurality of polymer layers 104. In some embodiments, each of the redistribution layers 103 includes copper, nickel, titanium, a combination thereof, or the like, and is formed by photolithography, plating, and photoresist stripping processes. In some embodiments, each of the polymer layers 104 includes a polymer material such as polybenzoxazole (PBO), polyimide (PI), benzocyclobutene (BCB), a combination thereof or the like, and is formed by a suitable fabrication technique such as spin-coating, lamination, deposition or the like. In some embodiments, the redistribution layer structure 102 further includes a plurality of connecting pads 105 configured to connect to a semiconductor chip.

Figure 1B:
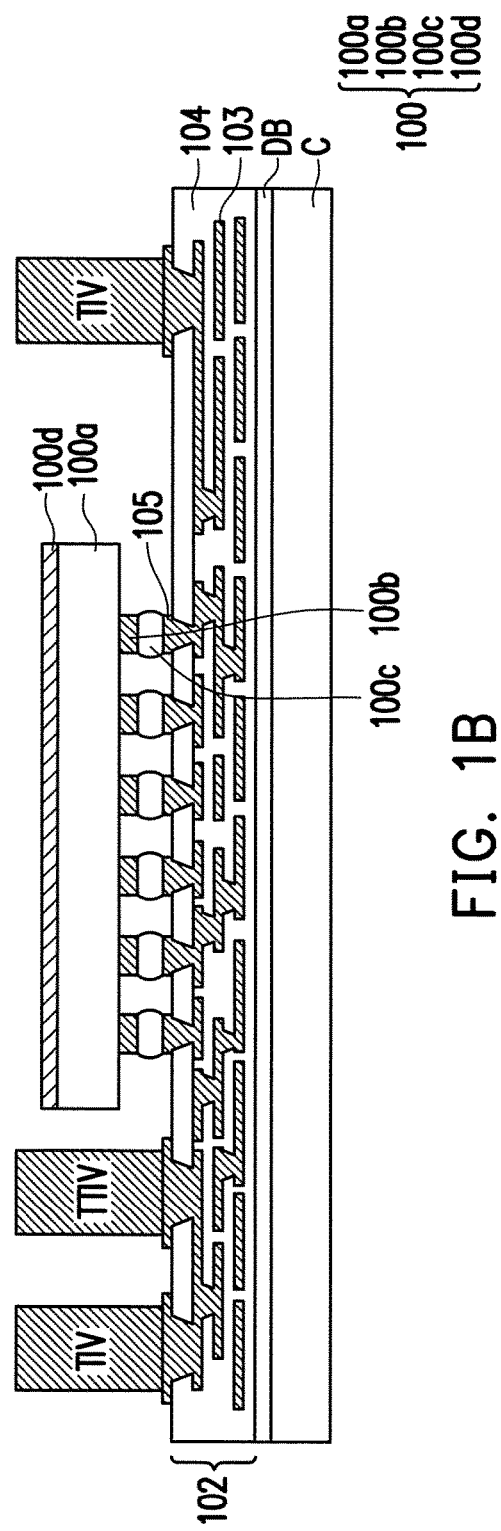

Referring to FIG. 1B, a plurality of through integrated fan-out vias TIV are formed over the redistribution layer structure 102. In some embodiments, the through integrated fan-out vias TIV are electrically connected to the redistribution layer structure 102. In some embodiments, the through integrated fan-out vias TIV include copper, nickel, titanium, a combination thereof, or the like, and are formed by photolithography, plating, and photoresist stripping processes. In some embodiments, at least one thermal through integrated fan-out via TTIV is formed during the step of forming the through integrated fan-out vias TIV. In some embodiments, the at least one thermal through integrated fan-out via TTIV and the through integrated fan-out vias TIV are defined by the same photolithography mask in the same process step. The thermal through integrated fan-out via TTIV is configured to constitute a part of a path for heat dissipation. In some embodiments, the at least one thermal through integrated fan-out via TTIV has a dimension (e.g., width, height and/or pitch) the same as that of the through integrated fan-out vias TIV. In alternative embodiments, the at least one thermal through integrated fan-out via TTIV and the through integrated fan-out vias TIV may have different dimensions. For example, the width of the at least one thermal through integrated fan-out via TTIV is greater than the width of through integrated fan-out vias TIV, so as to dissipate heat more effectively.

In some embodiments, the thermal through integrated fan-out via TTIV includes a material the same as that of the through integrated fan-out vias TIV. In alternative embodiments, the thermal through integrated fan-out via TTIV includes a material different from that of the through integrated fan-out vias TIV.

Thereafter, a first semiconductor chip 100 is placed on and bonded to the redistribution layer structure 102. In some embodiments, the first semiconductor chip 100 is placed adjacent to the at least one thermal through integrated fan-out via TTIV and aside the through integrated fan-out vias TIV. In some embodiments, the at least one thermal through integrated fan-out via TTIV is between the first semiconductor chip 100 and one of the through integrated fan-out vias TIV.

In some embodiments, the first semiconductor chip 100 includes a substrate 100a, one or more connectors 100b, one or more bumps 100c and a heat dissipation layer 100d. The substrate 100a includes, for example but not limited to, bulk silicon, doped or undoped, or an active layer of a semiconductor-on-insulator (SOI) substrate. The connectors 100b and the heat dissipation layer 100d are on opposite surfaces of the first semiconductor chip 100. In some embodiments, the heat dissipation layer 100d is formed on a first surface (e.g., back surface) of the first semiconductor chip 100, and the connectors 100b are formed on a second surface (e.g., front surface) of the first semiconductor chip 100 opposite to the first surface. In some embodiments, the first semiconductor chip 100 is a system-on-chip (SOC) die. In some embodiments, the first semiconductor chip 100 includes a high power circuit.

In some embodiments, the heat dissipation layer 100d has a high thermal conductivity greater than about 50 W/m*K or about 100 W/m*K. In some embodiments, the heat dissipation layer 100d includes a metal and/or a metal alloy and is formed by a suitable method such as physical vapor deposition (PVD), sputtering, evaporation, chemical vapor deposition (CVD) or electroplating. In alternative embodiments, the heat dissipation layer 100d includes a composite material with a high thermal conductivity. In some embodiments, the heat dissipation layer includes Al, Cu, Ni, Co, Ti, W, silicon carbide, aluminum nitride, graphite or a combination thereof, although other types of heat dissipation materials may be used.

In some embodiments, the heat dissipation layer 100d is a blanket layer that covers the entire back surface of the first semiconductor chip 100, as shown in FIG. 3. In alternative embodiments, the heat dissipation layer 100d is a patterned layer that covers a portion of the back surface of the first semiconductor chip 100. For example, the heat dissipation layer 100d has at least one opening O therein, as shown in FIG. 4. In some embodiments, the heat dissipation layer 100d can be block-shaped, strip-shaped, ring-shaped or any shape as needed.

In some embodiments, the connectors 100b are formed as the top portions of the first semiconductor chip 100 and are electrically connected to underlying pads or an interconnection structure of the first semiconductor chip 100. The connectors 100b may include copper-containing pillars, and are formed with an electroplating process. The bumps 100c are formed on the connectors 100b and may include solder bumps, and are formed with a ball drop process or an electroplating process. In some embodiments, the connectors 100b and/or the bumps 100c constitute parts of the connectors of the first semiconductor chip 100.

In some embodiments, the first semiconductor chip 100 is flipped such that the second surface or front surface of the first semiconductor chip 100 is facing downward (as shown) for subsequently bonding to the redistribution layer structure 102. In some embodiments, the first semiconductor chip 100 is bonded to the redistribution layer structure 102 with the connectors 100b (or bumps 100c) facing the redistribution layer structure 102. In some embodiments, the bumps 100c of the first semiconductor chip 100 are bonded to the connecting pads 105 of the redistribution layer structure 102.

Figure 1C:
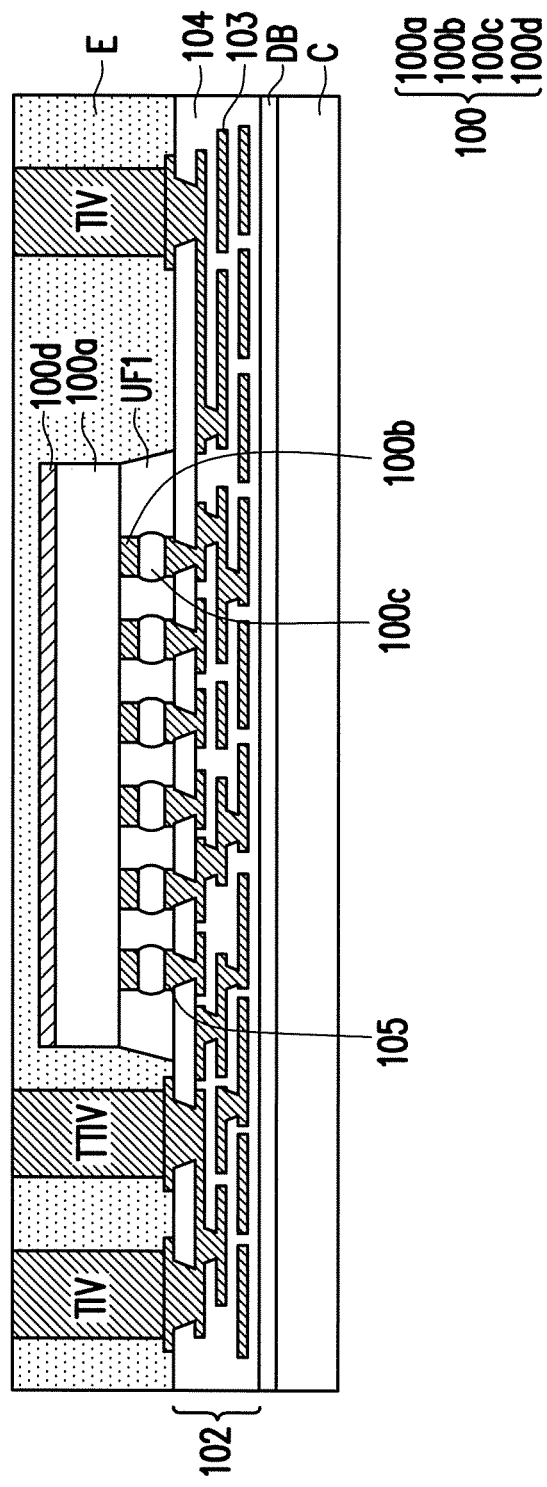

Referring to FIG. 1C, an underfill layer UF1 is formed to fill the space between the redistribution layer structure 102 and the first semiconductor chip 100. In some embodiments, the underfill layer UF1 is formed to surround the connectors 100b and the bumps 100c. In some embodiments, the underfill layer UF1 includes a molding compound such as epoxy, and is formed using dispensing, injecting, and/or spraying techniques.

Thereafter, the first semiconductor chip 100, the through integrated fan-out vias TIV and the at least one thermal through integrated fan-out via TTIV are encapsulated with an encapsulation layer E. In some embodiments, the encapsulation layer E is formed over the carrier C to encapsulate or surround the sidewalls of the through integrated fan-out vias TIV, the sidewall of the at least one thermal through integrated fan-out via TTIV and the sidewall and top of the first semiconductor chip 100. In some embodiments, the encapsulation layer E includes a molding compound, a molding underfill, a resin or the like, such as epoxy. In some embodiments, the encapsulation layer E includes a polymer material such as polybenzoxazole (PBO), polyimide, benzocyclobutene (BCB), a combination thereof, or the like, and is formed by a molding process followed by a grinding process until surfaces of the through integrated fan-out vias TIV and the surface of the thermal through integrated fan-out via TTIV are exposed.

Figure 1D:
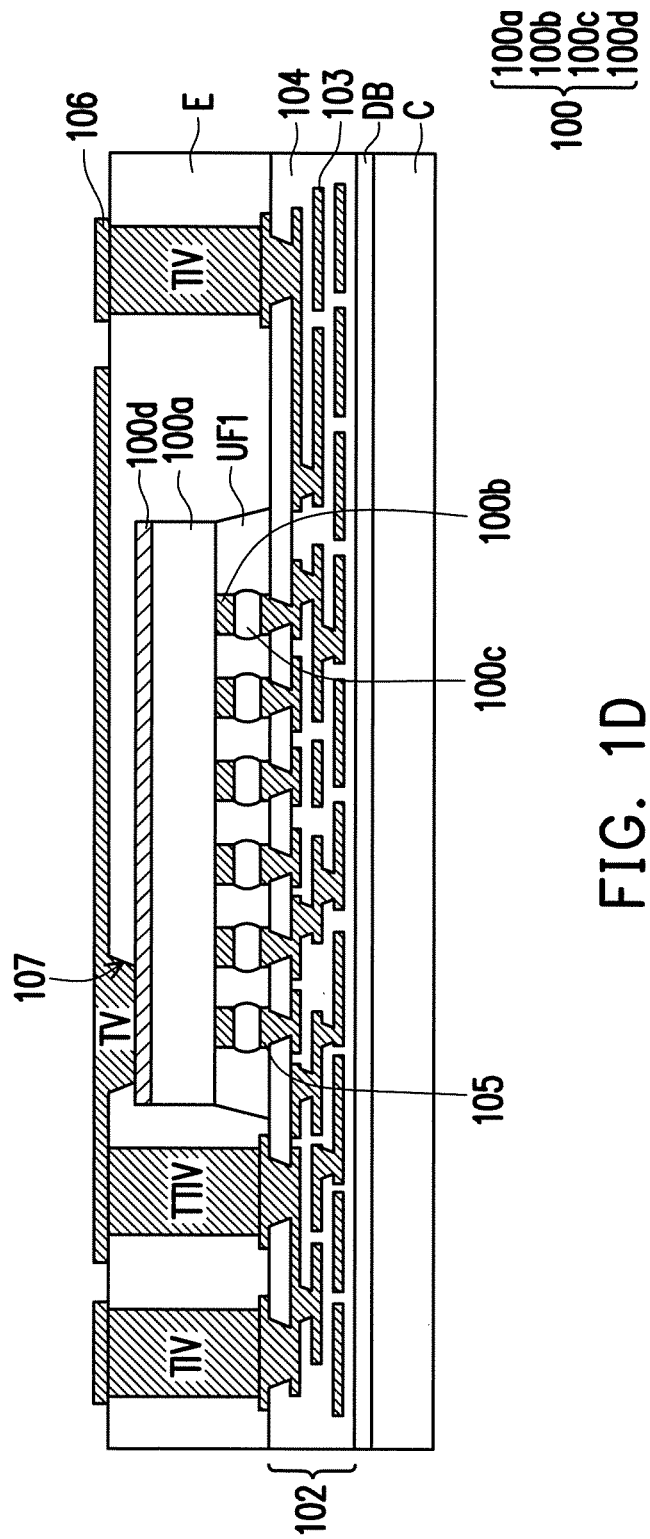

Referring to FIG. 1D, a redistribution layer structure 106 is formed over the first semiconductor chip 100. In some embodiments, the redistribution layer structure 106 is formed to thermally connect to the heat dissipation layer 100d of the first semiconductor chip 100. In some embodiments, the redistribution layer structure 106 is referred to as a "backside redistribution layer structure" or "thermal redistribution layer structure" through the specification. In some embodiments, the redistribution layer structure 106 includes copper, nickel, titanium, a combination thereof, or the like, and is formed by photolithography, plating, and photoresist stripping processes.

In some embodiments, at least one thermal via TV is formed during the step of forming the redistribution layer structure 106, and the at least one thermal via TV is between and in physical contact with the redistribution layer structure 106 and the heat dissipation layer 100d of the first semiconductor chip 100.

In some embodiments, a patterning step is performed to the encapsulation layer E, so as to form at least one opening 107 in the encapsulation layer E. In some embodiments, the opening 107 exposes a portion of the heat dissipation layer 100d. In some embodiments, the patterning step includes a laser drilling process, a dry etching process, a suitable patterning method or a combination thereof. Thereafter, a metal layer is formed on the surface of the encapsulation layer E and fills in the opening 107. In some embodiments, more than one metal layer or one or more polymer layers can be included in the redistribution layer structure 106 upon the process requirements.

Figure 1E:
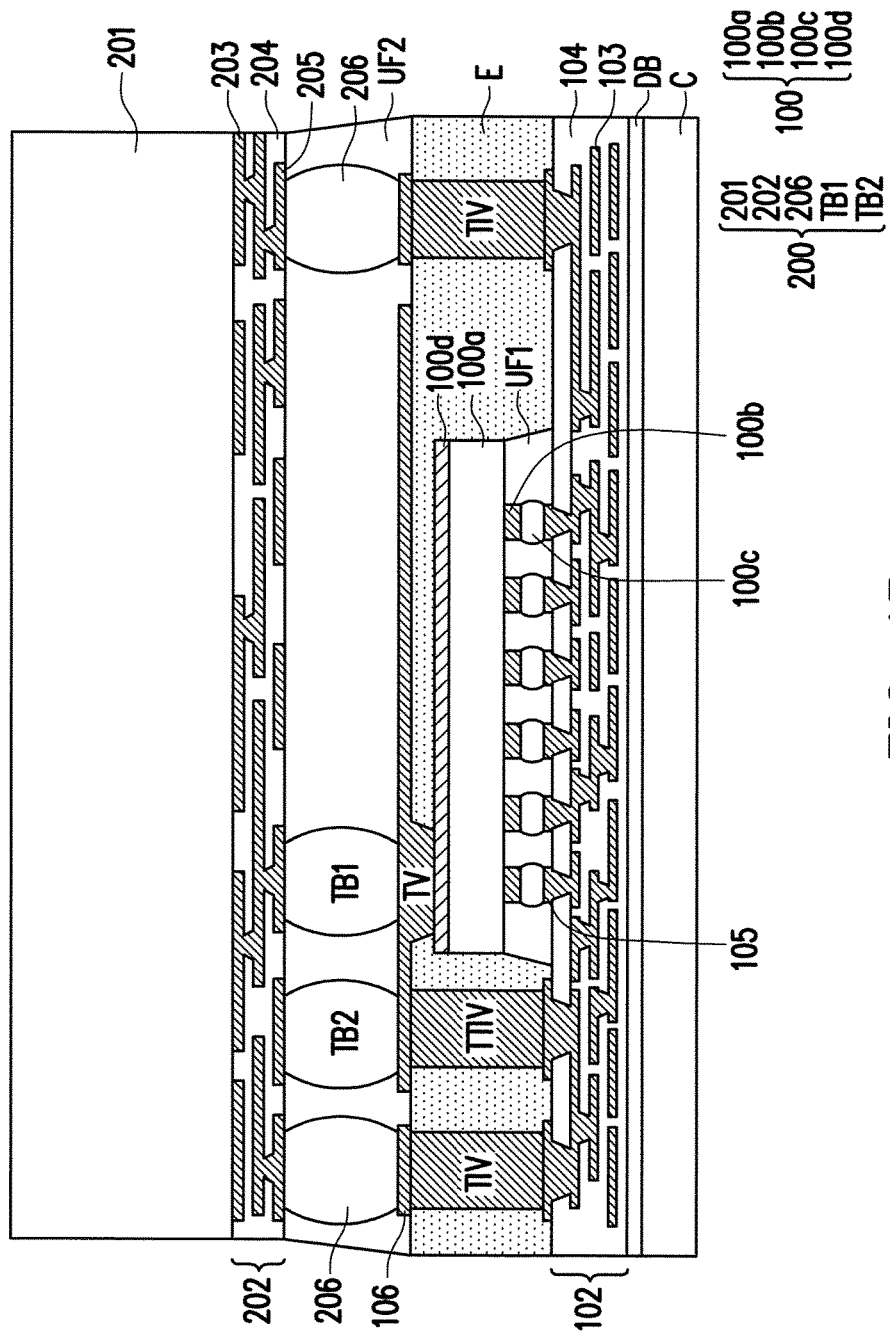

Referring to FIG. 1E, a package 200 including a second semiconductor chip 201 is provided and then bonded to the first semiconductor chip 100. The package 200 could be a wafer-level chip-scale package (WLCSP), a DRAM package or other package. In some embodiments, the package 200 further includes a conductive structure 202, a plurality of bumps 206 and a plurality of thermal bumps TB1 and TB2.

In some embodiments, the conductive structure 202 is a redistribution layer structure. In some embodiments, the conductive structure 202 is a front-side redistribution layer structure at a front side of the second semiconductor chip 201. In alternative embodiments, the conductive structure 202 is a backside redistribution layer structure at a back side of the second semiconductor chip 201. In alternative embodiments, the conductive structure 202 is an organic or ceramic substrate with conductive layers therein.

In some embodiments, the conductive structure 202 includes a plurality of conductive layers 203 embedded by a plurality of polymer layers 204. In some embodiments, each of the conductive layers 203 includes copper, nickel, titanium, a combination thereof, or the like, and is formed by photolithography, plating, and photoresist stripping processes. In some embodiments, each of the polymer layers 204 includes a polymer material such as polybenzoxazole (PBO), polyimide (PI), benzocyclobutene (BCB), a combination thereof or the like, and is formed by a suitable fabrication technique such as spin-coating, lamination, deposition or the like. In some embodiments, the conductive structure 202 further includes a plurality of connecting pads 205 configured to connect to bumps or a semiconductor chip.

The bumps 206 are formed on the connecting pads 205 of the conductive structure 202. In some embodiments, the bumps 206 may include solder bumps, and are formed with a ball drop process or an electroplating process. In some embodiments, one or more thermal bumps TB1 and TB2 are formed during the step of forming the bumps 206. In some embodiments, the bumps 206 are electrically connected to the through integrated fan-out via TIV, the thermal bump TB1 is thermally connected to the thermal via TV and therefore the heat dissipation layer 100d, and the thermal bump TB2 is thermally connected to the redistribution layer structure 106 and therefore the thermal through integrated fan-out via TTIV.

In some embodiments, the bumps 206 and the thermal bumps TB1 and TB2 are formed in the same process step. Each of the thermal bumps TB1 and TB2 is configured to constitute a part of a path for heat dissipation. In some embodiments, the thermal bumps TB1 and TB2 have a dimension (e.g., width and/or pitch) the same as that of the bumps 206. In alternative embodiments, at least one of the thermal bumps TB1 and TB2 and bumps 206 may have different dimensions. For example, the width of the thermal bump TB1 or TB2 is greater than the width of the bumps 206, so as to dissipate heat more effectively.

In some embodiments, the thermal bumps TB1 and TB2 include a material the same as that of the bumps 206. In alternative embodiments, the thermal bumps TB1 and TB2 include a material different from that of the bumps 206.

Thereafter, an underfill layer UF2 is formed to fill the space between the redistribution layer structure 106 and the package 200. In some embodiments, the underfill layer UF2 is formed to surround the bumps 206 and the thermal bumps TB1 and TB2. In some embodiments, the underfill layer UF2 includes a molding compound such as epoxy, and is formed using dispensing, injecting, and/or spraying techniques.

Figure 1F:
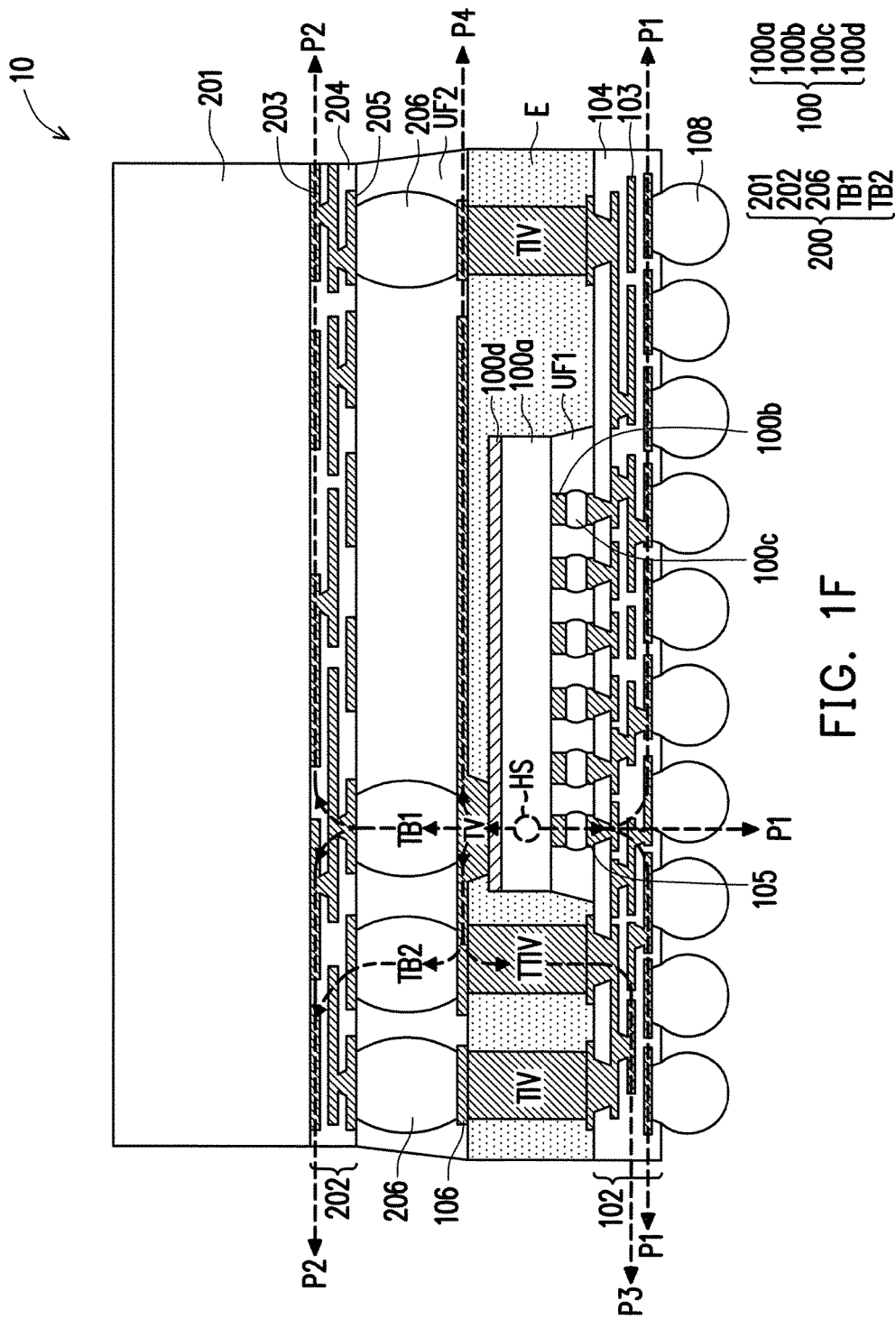

Referring to FIG. 1F, the carrier C is debonded from the redistribution layer structure 102. In some embodiments, the debonding layer DB is decomposed under heat of light, and the carrier C is then released from the structure formed thereon.

Thereafter, the lowermost polymer layer 104 is patterned such that openings are formed to expose the connecting pads or the lowermost redistribution layer 103 of the redistribution layer structure 102. In some embodiments, the openings are formed by a laser drilling process, a dry etching process, a suitable patterning method or a combination thereof. Thereafter, bumps 108 are placed over and bonded to the connecting pads of the redistribution layer structure 102. In some embodiments, the bumps 108 may be solder bumps, and/or may include metal pillars (e.g., copper pillars), solder caps formed on metal pillars, and/or the like. The bumps 108 may be formed respectively by a suitable process such as evaporation, electroplating, ball drop, or screen printing. An integrated fan-out package 10 is thus completed.

In some embodiments, when the first semiconductor chip 100 is operated, at least one hot spot HS is generated inside the first semiconductor chip 100, as shown in FIG. 1F. In some embodiments, the hot spot HS is generated at one corner of the first semiconductor chip 100, so the thermal vias TV, the thermal through integrated fan-out vias TTIV and metal lines of the redistribution layer structure 106 are arranged near the hot spot HS, so as to dissipate heat more effectively, as shown in FIG. 2.

In some embodiments, there are at least four heat dissipation paths P1 to P4, each of which helps to dissipate the heat generated inside the first semiconductor chip 100 to outside the first semiconductor chip 100, as shown in FIG. 1F. In some embodiments, a portion of the heat generated by the chip is dissipated to atmosphere (or an external environment) through the heat dissipation path P1 sequentially along the connectors 100b, the bumps 100c and the redistribution layer structure 102 and the bumps 108. Another portion of the heat generated by the chip is dissipated to atmosphere through the heat dissipation path P2 sequentially along the heat dissipation layer 100d, the at least one thermal via TV, the redistribution layer structure 106, the thermal bump TB1 or TB2 and the conductive structure 202. Another portion of the heat generated by the chip is dissipated to atmosphere through the heat dissipation path P3 sequentially along the heat dissipation layer 100d, the at least one thermal via TV, the redistribution layer structure 106, the at least one thermal through integrated fan-out via TTIV and the redistribution layer structure 102. Another portion of the heat generated by the chip is dissipated to atmosphere through the heat dissipation path P4 sequentially along the heat dissipation layer 100d, the at least one thermal via TV and the redistribution layer structure 106.

Possible modifications and alterations can be made to the integrated fan-out package. These modifications and alterations are provided for illustration purposes, and are not construed as limiting the present disclosure. FIG. 5 to FIG. 8 are cross-sectional views of integrated fan-out packages in accordance with alternative embodiments.

Figure 5:
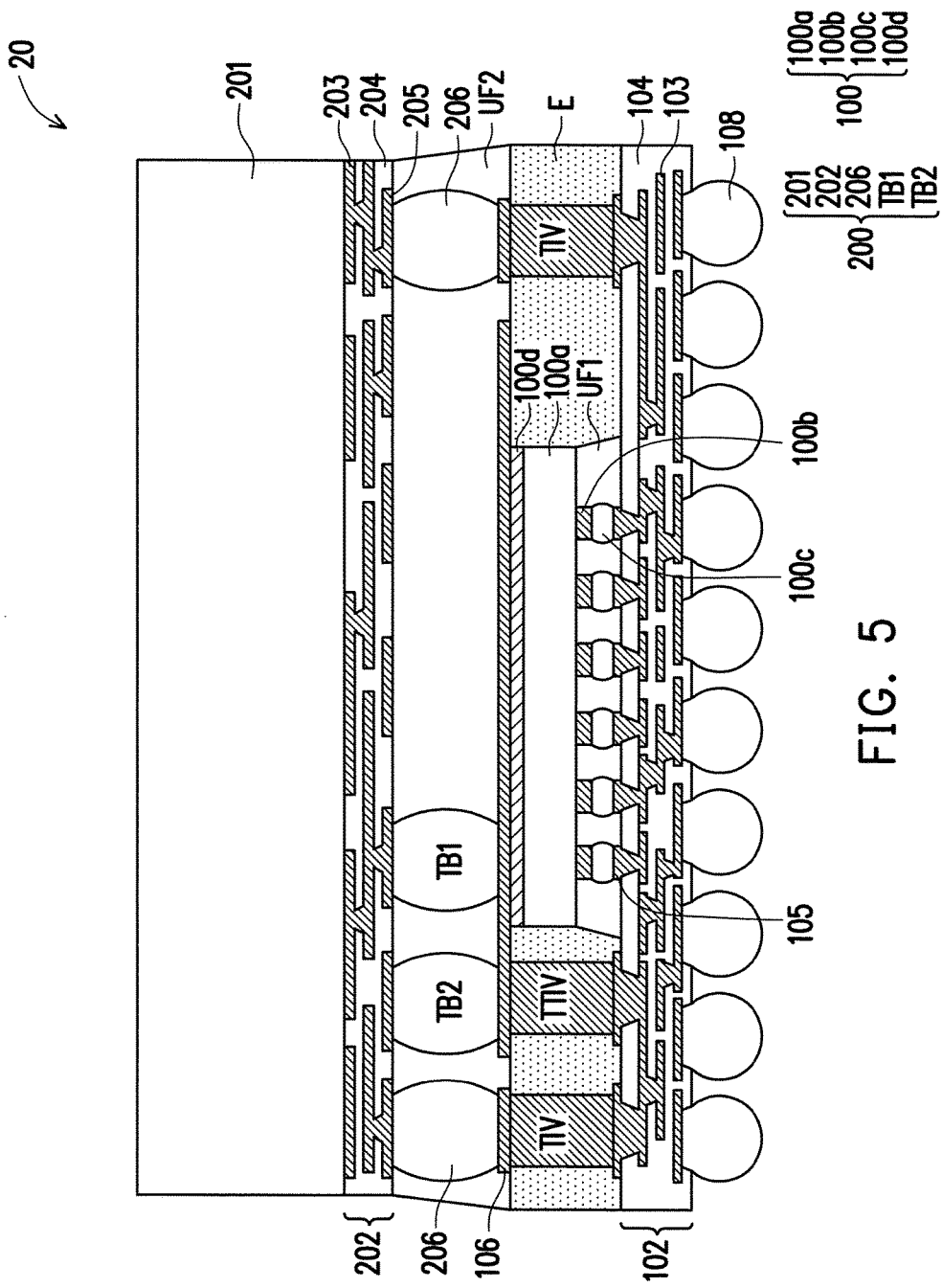
FIG. 5 to FIG. 8 are cross-sectional views of integrated fan-out packages in accordance with alternative embodiments.

The integrated fan-out package 20 of FIG. 5 is similar to the integrated fan-out package 10 of FIG. 1F, and the difference between them lies in that, the integrated fan-out package 20 of FIG. 5 is provided without a thermal via TV. In some embodiments, the redistribution layer structure 106 is formed to be in physical contact with the heat dissipation layer 100d of the first semiconductor chip 100. In some embodiments, at least one thermal bump TB1 is provided in the integrated fan-out package 20, and the at least one thermal bump TB1 is thermally connected to the redistribution layer structure 106 and therefore the heat dissipation layer 100d. In alternative embodiments, the integrated fan-out package 20 is provided without a thermal bump TB1.

Figure 6:
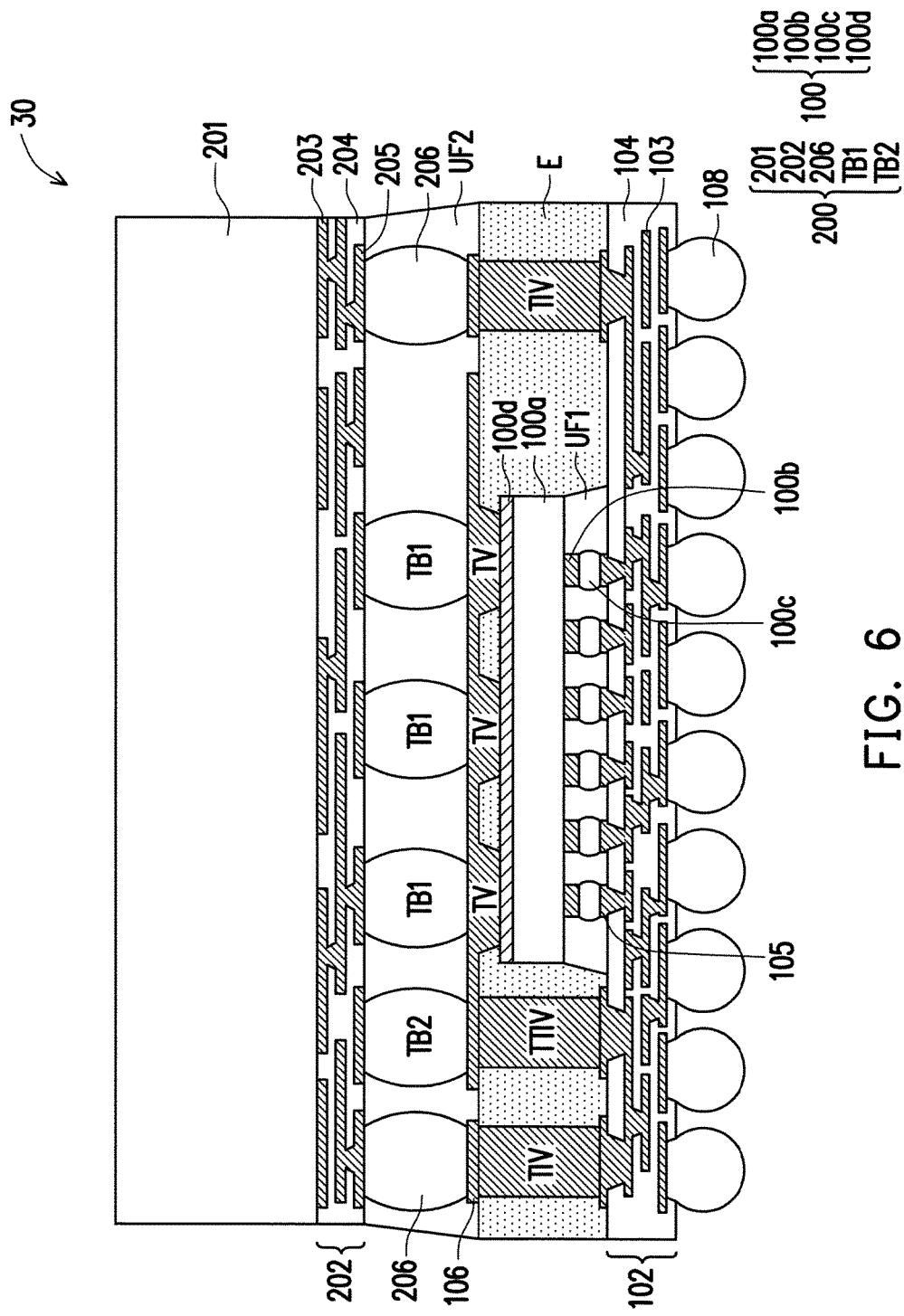

The integrated fan-out package 30 of FIG. 6 is similar to the integrated fan-out package 10 of FIG. 1F, and the difference between them lies in that, one thermal via TV and one thermal bump TB1 are shown in this cross-section of FIG. 1f, while multiple thermal vias TV and multiple thermal bumps TB1 are shown in this cross-section of FIG. 6. Specifically, the thermal vias TV and the thermal bumps TB1 are arranged in an array, either regularly or irregularly.

Figure 7:
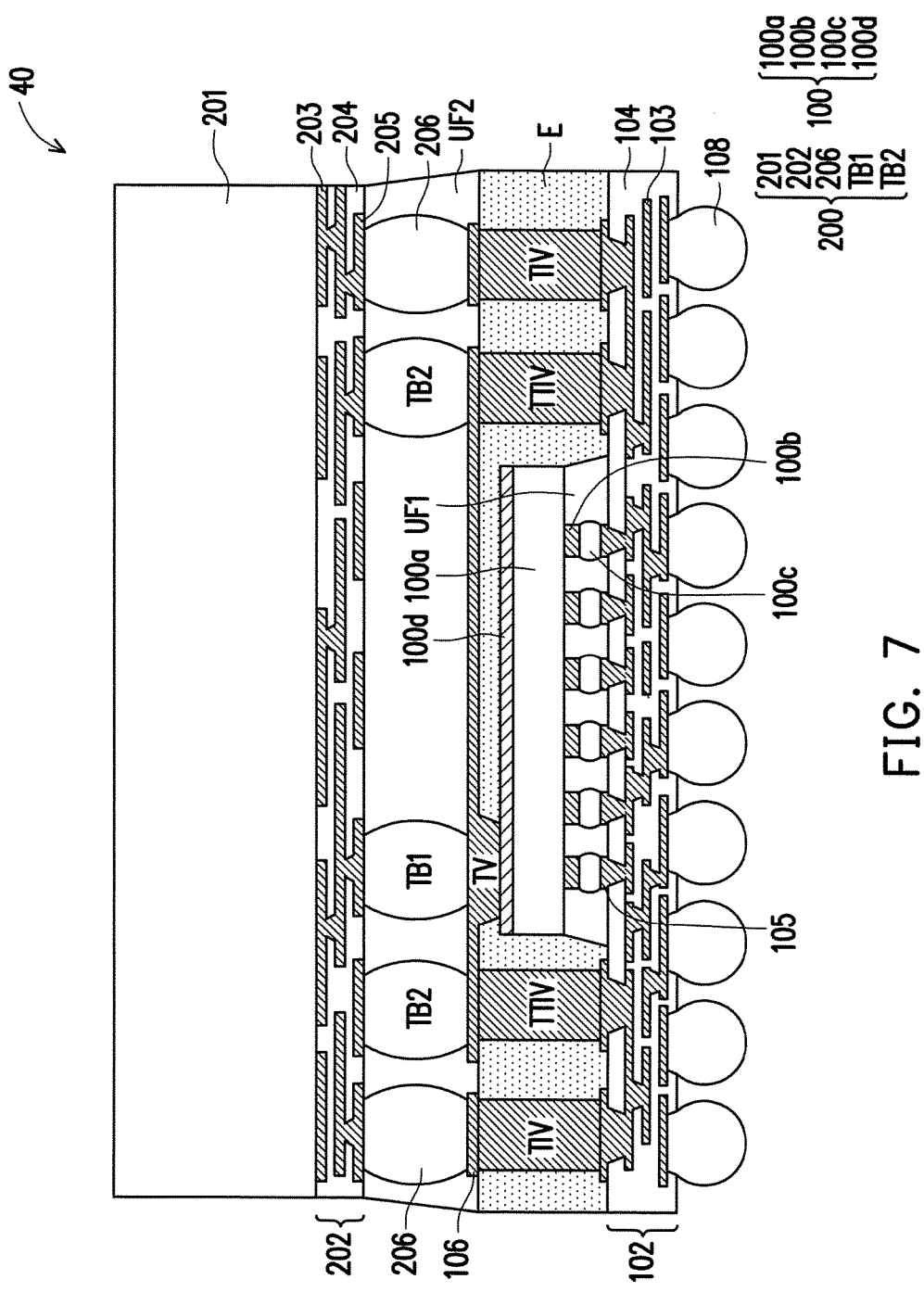

The integrated fan-out package 40 of FIG. 7 is similar to the integrated fan-out package 10 of FIG. 1F, and the difference between them lies in that, the thermal through integrated fan-out vias TTIV and the thermal bumps TB2 of the integrated fan-out package 10 are arranged at one side of the first semiconductor chip 100, while the thermal through integrated fan-out vias TTIV and the thermal bumps TB2 of the integrated fan-out package 40 are arranged at both sides of the first semiconductor chip 100.

Figure 8:
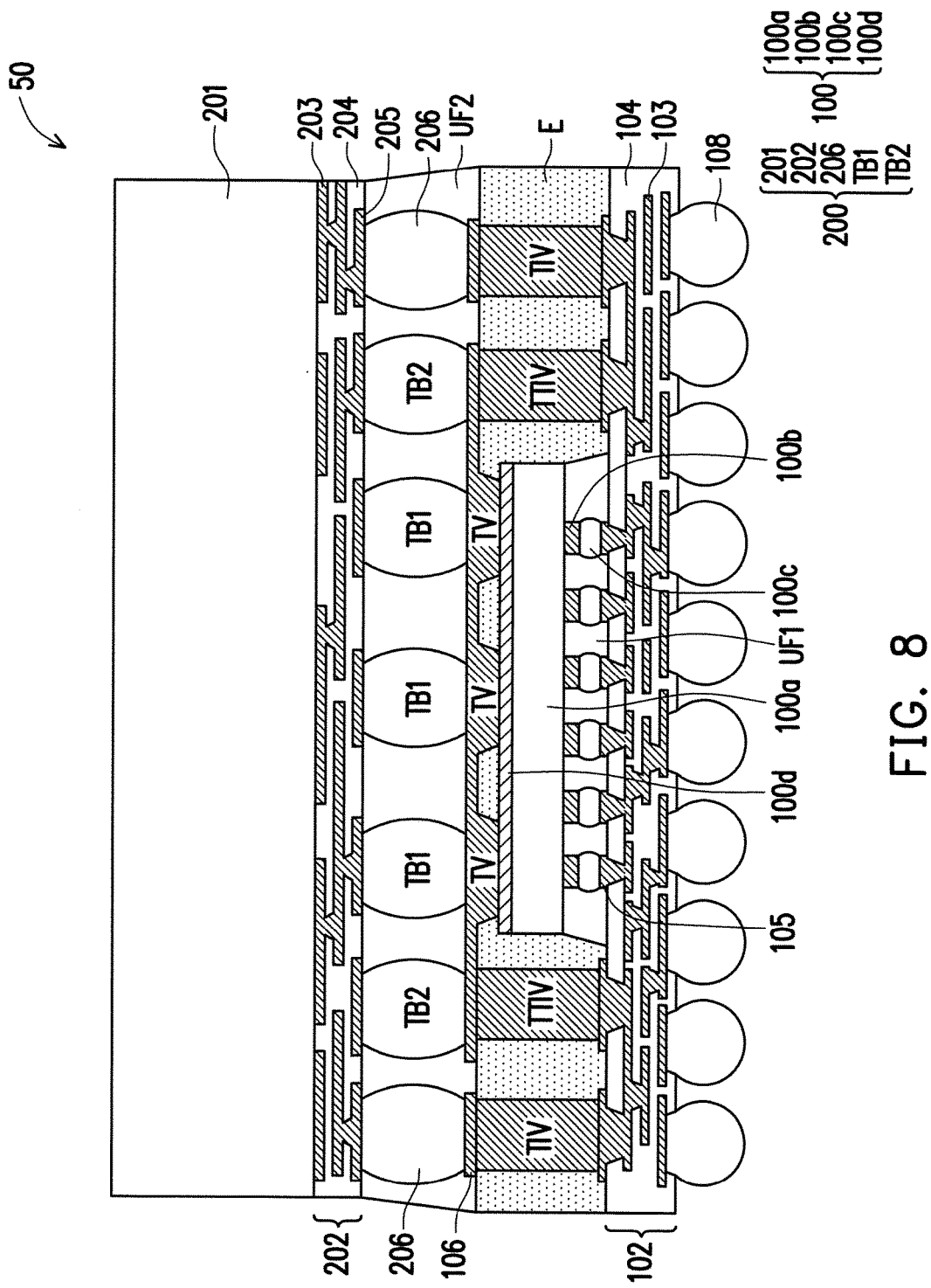

The design concepts of the integrated fan-out package 30 of FIG. 6 and the integrated fan-out package 40 of FIG. 7 can be combined, so as to provide an integrated fan-out package 50 which can dissipate heat more effectively, as shown in FIG. 8.

The structures of the integrated fan-out packages are illustrated below with reference to FIG. 1F and FIGS. 5-8. In some embodiments, an integrated fan-out package 10/20/30/40/50 includes a first semiconductor chip 100, a plurality of through integrated fan-out vias TIV, an encapsulation layer E and a redistribution layer structure 106.

The first semiconductor chip 100 includes a heat dissipation layer 100d on a first side (e.g., backside) thereof. In some embodiments, the heat dissipation layer 100d includes Al, Cu, Ni, Co, Ti, W, silicon carbide, aluminum nitride, graphite or a combination thereof. In some embodiments, the heat dissipation layer 100d covers at least a portion of a first surface (e.g., back surface) of the first semiconductor chip 100. In some embodiments, the heat dissipation layer 100d covers at least 30 percent of the first surface (e.g., back surface) of the first semiconductor chip 100.

In some embodiments, the ratio of the area of the heat dissipation layer 100d to the total backside area (or chip area) of the first semiconductor chip 100 is more than about 0.30 or 0.50. In some embodiments, the area ratio of the heat dissipation layer 100d to the first semiconductor chip 100 can be, for example but not limited to, about 0.30, 0.35, 0.40, 0.45, 0.50, 0.55, 0.60, 0.65, 0.70, 0.75, 0.80, 0.85, 0.90, 0.95, 1.00, including any range between any two of the preceding values and any range more than any one of the preceding values. In some embodiments, the area ratio of the heat dissipation layer 100d to the first semiconductor chip 100 is such as to improve the heat dissipation efficiency.

In some embodiments, the heat dissipation layer 100d completely covers the first surface (e.g., back surface) of the first semiconductor chip 100. Specifically, the area of the heat dissipation layer 100d is substantially the same as the chip area of the first semiconductor chip 100. For example, the heat dissipation layer 100d may be a blanket layer such as a solid metal block, as shown in FIG. 3. However, the disclosure is not limited thereto.

In alternative embodiments, the heat dissipation layer 100d may cover a backside region corresponding to the hot spot HS of the first semiconductor chip 100. For example, the heat dissipation layer 100d has openings O therein, as shown in FIG. 4. The openings O are circular, oval, square, rectangular, polygonal or a combination thereof. In some embodiments, in order to balance the thermal dissipation of the first semiconductor chip 100, the heat dissipation layer 100d may be designed to have one or more openings, so that the heat can be distributed across the chip evenly. In some embodiments, on the hot spot HS of the first semiconductor chip 100, the corresponding backside of the chip is fully covered by the heat dissipation layer 100d. In contrast, on a less heat portion of the first semiconductor chip 100, openings in the heat dissipation layer 100d may lead to a balanced thermal distribution in the first semiconductor chip 100.

In some embodiments, the first semiconductor chip 100 further includes connectors 100c and optional bumps 100b on a second surface (e.g., front surface) opposite to the first surface (e.g., back surface), and the connectors 100d and the optional bumps 100b are electrically connected to another redistribution layer structure 102 at a second side (e.g., front side) of the first semiconductor chip 100 opposite to the first side (e.g., backside).

The through integrated fan-out vias TIV are aside the first semiconductor chip 100. The encapsulation layer E encapsulates the through integrated fan-out vias TIV. The redistribution layer structure 106 is at a first side (e.g., backside) of the first semiconductor chip 100 and is thermally connected to the heat dissipation layer 100d of the first semiconductor chip 100.

In some embodiments, the integrated fan-out package 10/20/30/40/50 further includes at least one thermal through integrated fan-out via TTIV between the first semiconductor chip 100 and one of the through integrated fan-out vias TIV, and the encapsulation layer E further encapsulates the at least one thermal through integrated fan-out via TTIV.

In some embodiments, the integrated fan-out package 10/30/40/50 further includes at least one thermal via TV between and in physical contact with the redistribution layer structure 106 and the heat dissipation layer 100d of the first semiconductor chip 100, and the encapsulation layer E further encapsulates the at least one thermal via TV. In some embodiments, multiple thermal vias TV are distributed evenly in the chip region. In alternative embodiments, multiple thermal vias TV are distributed randomly and unevenly in the chip region. In some embodiments, the thermal vias TV are circular, oval, square, rectangular, polygonal or a combination thereof. The shapes, sizes, variations, configurations and/or distributions of the thermal vias TV can be adjusted upon the process requirements.

In alternative embodiments, a thermal via TV is not provided in the package, such the redistribution layer structure 106 is in physical contact with the heat dissipation layer 100d of the first semiconductor chip 100, as shown in the integrated fan-out package 20 of FIG. 5.

In some embodiments, the integrated fan-out package 10/20/30/40/50 further includes a second semiconductor chip 201 electrically connected to the first semiconductor chip 100, and thermal bumps TB1 and TB2 between the second semiconductor chip 201 and the redistribution layer structure 106. The thermal bumps TB1 and TB2 are thermally connected to the at least one thermal via TV. In some embodiments, the redistribution layer structure 106 is between and in physical contact with the at least one thermal via TV and the at least one thermal bump TB1. In some embodiments, the redistribution layer structure 106 is between and in physical contact with the at least one thermal through integrated fan-out via TTIV and the at least one thermal bump TB2.

In some embodiments, the dimension of the at least one thermal via TV is greater than the dimension of the through integrated fan-out vias TIV or the thermal through integrated fan-out vias TTIV. In alternative embodiments, the dimension of the at least one thermal via TV can be equal to or less than the dimension of the through integrated fan-out vias TIV or the thermal through integrated fan-out vias TTIV.

In view of the above, in some embodiments of the disclosure, by disposing at least one of a heat dissipation layer, a thermal redistribution layer structure, thermal vias, thermal bumps and thermal through integrated fan-out vias around hot spots of a chip, the heat dissipation efficiency of the package is greatly increased. In some embodiments, other thermal elements such as thermal through substrate vias or the like can be further disposed in the package as needed. By adopting the heat dissipation schemes of some embodiments of the disclosure, not only the operation temperature of the package is reduced, the hot spots are also eliminated. The package performance is accordingly improved.

In accordance with some embodiments of the present disclosure, an integrated fan-out package includes a first semiconductor chip, a plurality of through integrated fan-out vias, an encapsulation layer and a redistribution layer structure. The first semiconductor chip includes a heat dissipation layer, and the heat dissipation layer covers at least 30 percent of a first surface of the first semiconductor chip. The through integrated fan-out vias are aside the first semiconductor chip. The encapsulation layer encapsulates the through integrated fan-out vias. The redistribution layer structure is at a first side of the first semiconductor chip and thermally connected to the heat dissipation layer of the first semiconductor chip.

In accordance with alternative embodiments of the present disclosure, an integrated fan-out package includes a first semiconductor chip, a plurality of through integrated fan-out vias, a redistribution layer structure, at least one thermal via, an encapsulation layer and a second semiconductor chip. The first semiconductor chip includes a heat dissipation layer on a first surface thereof. The through integrated fan-out vias are aside the first semiconductor chip. The redistribution layer structure is over the first semiconductor chip and thermally connected to the heat dissipation layer. The at least one thermal via is between and in physical contact with the redistribution layer structure and the heat dissipation layer of the first semiconductor chip. The encapsulation layer encapsulates the plurality of through integrated fan-out vias and the least one thermal via. The second semiconductor chip is over the redistribution layer structure and electrically connected to the first semiconductor chip.

In accordance with yet alternative embodiments of the present disclosure, a method of forming an integrated fan-out package includes at least the following steps. A plurality of through integrated fan-out vias are formed over a first redistribution layer structure. A first semiconductor chip is placed over the first redistribution layer structure, wherein the first semiconductor chip includes at least one connector and a heat dissipation layer on opposite surfaces thereof, and the at least one connector faces the first redistribution layer structure. The first semiconductor chip and the plurality of through integrated fan-out vias are encapsulated with an encapsulation layer. A second redistribution layer structure is formed over the first semiconductor chip, wherein the second redistribution layer structure is thermally connected to the heat dissipation layer of the first semiconductor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
   a first semiconductor chip comprising a heat dissipation layer, the heat dissipation layer covering at least 30 percent of a first surface of the first semiconductor chip, wherein an edge of the heat dissipation layer is aligned with an edge of the first semiconductor chip;
   a plurality of through integrated fan-out vias aside the first semiconductor chip;
   an encapsulation layer encapsulating the plurality of through integrated fan-out vias; and
   a redistribution layer structure at a first side of the first semiconductor chip and thermally connected to the heat dissipation layer of the first semiconductor chip.

2. The integrated fan-out package of claim 1, wherein the heat dissipation layer completely covers the first surface of the first semiconductor chip.

3. The integrated fan-out package of claim 1, wherein the heat dissipation layer comprises Al, Cu, Ni, Co, Ti, W, silicon carbide, aluminum nitride, graphite or a combination thereof.

4. The integrated fan-out package of claim 1, further comprising at least one thermal via between and in physical contact with the redistribution layer structure and the heat dissipation layer of the first semiconductor chip, wherein the encapsulation layer further encapsulates the at least one thermal via.

5. The integrated fan-out package of claim 1, further comprising:
a second semiconductor chip electrically connected to the first semiconductor chip; and
at least one thermal bump between the second semiconductor chip and the redistribution layer structure, wherein the at least one thermal bump is thermally connected to the heat dissipation layer of the first semiconductor chip.

6. The integrated fan-out package of claim 1, wherein the redistribution layer structure is in physical contact with the heat dissipation layer of the first semiconductor chip.

7. The integrated fan-out package of claim 1, further comprising at least one thermal through integrated fan-out via between the first semiconductor chip and one of the plurality of through integrated fan-out vias, wherein the encapsulation layer further encapsulates the at least one thermal through integrated fan-out via.

8. The integrated fan-out package of claim 1, wherein the first semiconductor chip further comprises connectors on a second surface thereof, the second surface is opposite to the first surface, and the connectors are electrically connected to another redistribution layer structure at a second side of the first semiconductor chip opposite to the first side.

9. An integrated fan-out package, comprising:
a first semiconductor chip comprising a heat dissipation layer on a first surface thereof;
a plurality of through integrated fan-out vias aside the first semiconductor chip;
a redistribution layer structure over the first semiconductor chip and thermally connected to the heat dissipation layer;
at least one thermal via between and in physical contact with the redistribution layer structure and the heat dissipation layer of the first semiconductor chip;
an encapsulation layer encapsulating the plurality of through integrated fan-out vias and the least one thermal via; and
a second semiconductor chip over the redistribution layer structure and electrically connected to the first semiconductor chip.

10. The integrated fan-out package of claim 9, wherein the heat dissipation layer completely covers the first surface of the first semiconductor chip.

11. The integrated fan-out package of claim 9, wherein the heat dissipation layer has at least one opening therein.

12. The integrated fan-out package of claim 9, wherein the heat dissipation layer comprises Al, Cu, Ni, Co, Ti, W, silicon carbide, aluminum nitride, graphite or a combination thereof.

13. The integrated fan-out package of claim 9, further comprising at least one thermal bump between the second semiconductor chip and the redistribution layer structure, wherein the at least one thermal bump is thermally connected to the at least one thermal via.

14. The integrated fan-out package of claim 9, further comprising at least one thermal through integrated fan-out via between the at least one thermal via and one of the plurality of through integrated fan-out vias, wherein the encapsulation layer further encapsulates the at least one thermal through integrated fan-out via.

15. The integrated fan-out package of claim 9, wherein the first semiconductor chip further comprises connectors on a second surface thereof, the second surface is opposite to the first surface, and the connectors are electrically connected to another redistribution layer structure.

16. A method of forming an integrated fan-out package, comprising:
forming a plurality of through integrated fan-out vias over a first redistribution layer structure;
placing a first semiconductor chip over the first redistribution layer structure, wherein the first semiconductor chip comprises at least one connector and a heat dissipation layer on opposite surfaces thereof, and the at least one connector faces the first redistribution layer structure, wherein an edge of the heat dissipation layer is aligned with an edge of the first semiconductor chip;
encapsulating the first semiconductor chip and the plurality of through integrated fan-out vias with an encapsulation layer; and
forming a second redistribution layer structure over the first semiconductor chip, wherein the second redistribution layer structure is thermally connected to the heat dissipation layer of the first semiconductor chip.

17. The method of claim 16, further comprising forming at least one thermal via during the step of forming the second redistribution layer structure, wherein the at least one thermal via is between and in physical contact with the second redistribution layer structure and the heat dissipation layer of the first semiconductor chip.

18. The method of claim 16, further comprising forming at least one thermal through integrated fan-out via during the step of forming the plurality of through integrated fan-out vias, wherein the at least one thermal through integrated fan-out via is between the first semiconductor chip and one of the plurality of through integrated fan-out vias.

19. The method of claim 16, further comprising bonding a package comprising a second semiconductor chip to the first semiconductor chip, wherein the package further comprises a plurality of bumps and at least one thermal bump, the plurality of bumps are electrically connected to the plurality of through integrated fan-out vias, and the at least one thermal bump is thermally connected to the heat dissipation layer of the first semiconductor chip.

20. The method of claim 16, wherein the heat dissipation layer comprises Al, Cu, Ni, Co, Ti, W, silicon carbide, aluminum nitride, graphite or a combination thereof.

* * * * *